US012222751B2

(12) United States Patent
Hu et al.

(10) Patent No.: US 12,222,751 B2
(45) Date of Patent: Feb. 11, 2025

(54) DISPLAY PANEL AND DISPLAY DEVICE WITH LIGHT-TRANSMITTING HOLES DISTRIBUTED ALONG A RING SHAPE

(71) Applicant: Wuhan Tianma Micro-Electronics Co., Ltd., Wuhan (CN)

(72) Inventors: Suli Hu, Wuhan (CN); Yangzhao Ma, Wuhan (CN); Zhiqiang Xia, Wuhan (CN); Ruiyuan Zhou, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 658 days.

(21) Appl. No.: 16/840,589

(22) Filed: Apr. 6, 2020

(65) Prior Publication Data
US 2021/0200263 A1    Jul. 1, 2021

(30) Foreign Application Priority Data

Dec. 31, 2019   (CN) .......................... 201911413899.9

(51) Int. Cl.
G06F 1/16 (2006.01)
G06F 1/18 (2006.01)
H01L 27/146 (2006.01)

(52) U.S. Cl.
CPC .......... *G06F 1/1605* (2013.01); *G06F 1/1626* (2013.01); *G06F 1/189* (2013.01); *H01L 27/14605* (2013.01); *H01L 27/14629* (2013.01)

(58) Field of Classification Search
CPC ...... G06F 1/1605; G06F 1/1626; G06F 1/189; H01L 27/14605; H01L 27/14629; H01L 27/3244; H01L 27/3234
See application file for complete search history.

(56) References Cited

U.S. PATENT DOCUMENTS

| 2009/0147379 A1* | 6/2009 | Li | H01L 27/14627 |
| | | | 359/741 |
| 2019/0095674 A1* | 3/2019 | Ko | G02B 19/0009 |
| 2020/0104562 A1* | 4/2020 | Sung | H01L 31/12 |

(Continued)

FOREIGN PATENT DOCUMENTS

| CN | 108183989 A | 6/2018 |
| CN | 110061014 A | 7/2019 |

(Continued)

*Primary Examiner* — Nilufa Rahim
(74) *Attorney, Agent, or Firm* — Anova Law Group, PLLC

(57) ABSTRACT

A display panel and a display device are provided in the present disclosure. The display panel includes a first display region and a second display region. The second display region includes a plurality of light-transmitting hole combination regions. At least one light-transmitting hole group is disposed at each light-transmitting hole combination region; each light-transmitting hole group includes a plurality of light-transmitting holes; a boundary line of each light-transmitting hole is a closed arc; and centers of all light-transmitting holes in each light-transmitting hole group are distributed along a ring shape. The second display region further includes a plurality of pixels and a plurality of pixel drive circuits. Pixel drive circuits used for driving pixels in the light-transmitting hole combination region are first pixel drive circuits, and at least a portion of the first pixel drive circuits is at a region outside the light-transmitting hole combination region.

16 Claims, 17 Drawing Sheets

(56) References Cited

U.S. PATENT DOCUMENTS

| | | | | |
|---|---|---|---|---|
| 2020/0295300 | A1* | 9/2020 | Chung | H01L 51/5225 |
| 2020/0395433 | A1* | 12/2020 | Sung | H10K 59/131 |
| 2021/0020678 | A1* | 1/2021 | Sugimori | H01L 31/02366 |
| 2021/0183930 | A1* | 6/2021 | Takatsuka | H01L 27/14685 |
| 2021/0280617 | A1* | 9/2021 | Sugizaki | H01L 27/14636 |
| 2022/0326415 | A1* | 10/2022 | Yun | G02B 3/0012 |
| 2023/0228909 | A1* | 7/2023 | Hanania | G02B 3/0056 |
| | | | | 349/200 |

FOREIGN PATENT DOCUMENTS

| | | |
|---|---|---|
| CN | 209358576 U | 9/2019 |
| CN | 110365819 A | 10/2019 |
| CN | 110426903 A | 11/2019 |
| CN | 110492018 A | 11/2019 |

\* cited by examiner

DISPLAY PANEL AND DISPLAY DEVICE WITH LIGHT-TRANSMITTING HOLES DISTRIBUTED ALONG A RING SHAPE

CROSS-REFERENCE TO RELATED APPLICATION

This application claims the priority of Chinese Patent Application No. 201911413899.9, filed on Dec. 31, 2019, the content of which is incorporated herein by reference in its entirety.

TECHNICAL FIELD

The present disclosure generally relates to the field of display technology and, more particularly, relates to a display panel and a display device.

BACKGROUND

With the rapid development of display technology, the shape requirements, in addition to functions such as conventional information display and the like, of displays are gradually growing, and increasing screen-to-body ratios of the displays is the trend in the future display market. Therefore, display devices having under-screen camera structures are favored by consumers.

In the display device having an under-screen camera structure, a camera is disposed under a display region of the display panel. By reducing the resolution of the display region where the camera is located, light is able to pass through the display region of the display panel to reach the camera, such that the camera may capture pictures. However, due to the existence of the diffraction phenomenon, the image forming quality of the camera may be poor and pictures captured by the camera may be blurred.

SUMMARY

One aspect of the present disclosure provides a display panel. The display panel includes a first display region and a second display region. The second display region includes a plurality of light-transmitting hole combination regions. At least one light-transmitting hole group is disposed at each light-transmitting hole combination region; each light-transmitting hole group includes a plurality of light-transmitting holes; a boundary line of each light-transmitting hole is a closed arc; and centers of all light-transmitting holes in each light-transmitting hole group are distributed along a ring shape. The second display region further includes a plurality of pixels and a plurality of pixel drive circuits. Pixel drive circuits used for driving pixels in the light-transmitting hole combination region are first pixel drive circuits; and at least a portion of the first pixel drive circuits is at a region outside the light-transmitting hole combination region.

Another aspect of the present disclosure provides a display device. The display device may include the display panel including a first display region and a second display region. The second display region includes a plurality of light-transmitting hole combination regions. At least one light-transmitting hole group is disposed at each light-transmitting hole combination region; each light-transmitting hole group includes a plurality of light-transmitting holes; a boundary line of each light-transmitting hole is a closed arc; and centers of all light-transmitting holes in each light-transmitting hole group are distributed along a ring shape. The second display region further includes a plurality of pixels and a plurality of pixel drive circuits. Pixel drive circuits used for driving pixels in the light-transmitting hole combination region are first pixel drive circuits; and at least a portion of the first pixel drive circuits is at a region outside the light-transmitting hole combination region.

Other aspects of the present disclosure can be understood by those skilled in the art in light of the description, the claims, and the drawings of the present disclosure.

BRIEF DESCRIPTION OF THE DRAWINGS

In order to explain the technical solutions in the embodiments of the present disclosure or the existing technology more clearly, the drawings used in the description of the embodiments or the existing technology are briefly introduced hereinafter. Obviously, the drawings in the following description are merely certain embodiments of the present disclosure, and for those skilled in the art, other drawings may be obtained according to these drawings without creative efforts.

DETAILED DESCRIPTION

The technical solutions in the embodiments of the present disclosure may be clearly and completely described with reference to the drawings in the embodiments of the present disclosure hereinafter. Obviously, the described embodiments are merely a part of the embodiments of the present disclosure, but not all of the embodiments. All other embodiments, based on the embodiments in the present disclosure, obtained by those skilled in the art without creative efforts shall fall within the protection scope of the present disclosure.

In the following description, various specific details are set forth in order to fully understand the present disclosure. However, the present disclosure may also be implemented in other ways than described herein, and those skilled in the art may make similar spread without violating the connotation of the present disclosure, thus the present disclosure may not be limited by the embodiments disclosed hereinafter.

As mentioned above, due to the existence of the diffraction phenomenon, the image forming quality of the camera may be poor, and the pictures captured by the camera may be blurred.

Figure 1:
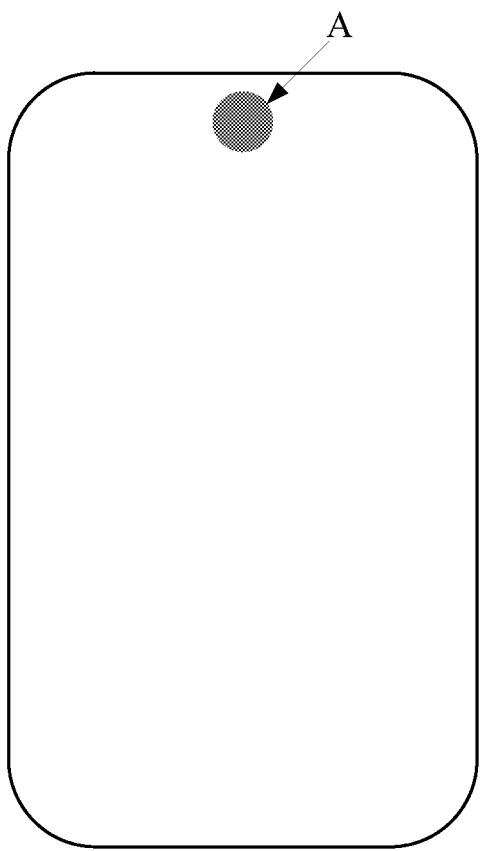
FIG. 1 illustrates a top view of a display panel, where a region A is an illustrative region of the surface of the display panel corresponding to a camera.

FIG. 1 illustrates a top view of a display panel, where a region A is an illustrative region of the surface of the display panel corresponding to a camera.

Figure 2:
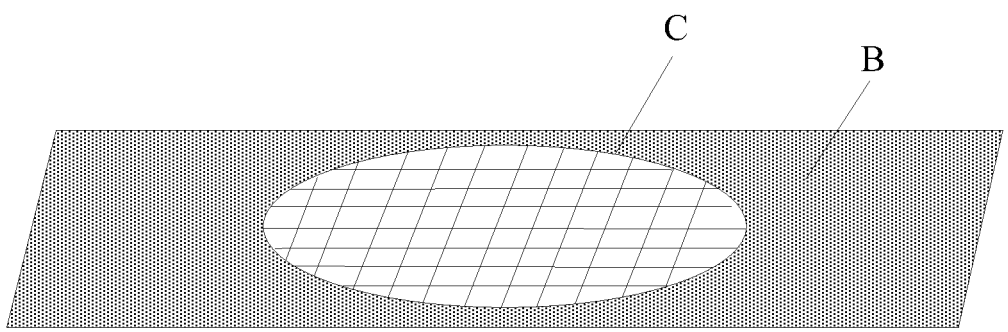
FIG. 2 illustrates a local enlarged view of a region A and a camera corresponding to the region A.
Figure 2:
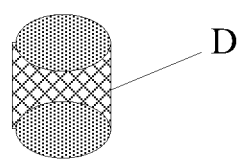
Figure 3:
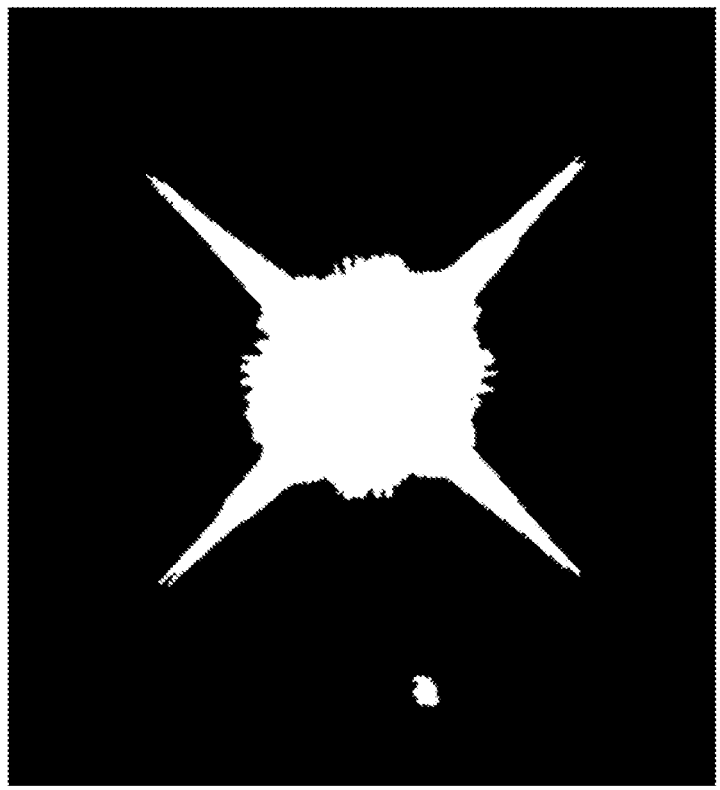
FIG. 3 illustrates a schematic of a spot formed by passing light through a light-transmitting region C in FIG. 2.

FIG. 2 illustrates a local enlarged view of a region A and a camera corresponding to the region A. It can be seen from FIG. 2 that the region, in the display panel, corresponding to a camera D may have light-transmitting holes arranged in a matrix, as a light-transmitting region C, and the remaining region may be used as a display region B. In such way, light may be provided to the camera D under the display panel through the light-transmitting region C, thereby enabling the camera D to capture pictures. FIG. 3 illustrates a schematic of a spot formed by passing light through the light-transmitting region C in FIG. 2. It can be seen from FIG. 3 that the interference phenomenon and the diffraction phenomenon of the spot may be relatively serious, which may affect the image forming quality of the camera D.

When light passes through each light-transmitting hole, the diffraction phenomenon occurs at the boundary line of the light-transmitting hole. The plurality of light-transmitting holes in the display panel are arranged in a matrix, so that the diffraction spots formed at the boundary lines of the light-transmitting holes may also be arranged in a matrix and adjacent diffraction spots may overlap and interfere with each other along a same direction, resulting in serious interference phenomenon and diffraction phenomenon of an entire spot formed by passing light through the light-transmitting region, which may affect the image forming quality of the camera D.

In order to solve above-mentioned problems, the present disclosure provides a display panel and a display device including the display panel. The display panel may include a first display region and a second display region. The second display region may include a plurality of light-transmitting hole combination regions. At least one light-transmitting hole group may be disposed at each light-transmitting hole combination region. Each light-transmitting hole group may include a plurality of light-transmitting holes. The boundary line of each light-transmitting hole may be a closed arc, such that diffraction light corresponding to different regions on the boundary line of the light-transmitting hole may overlap and interfere with each other along different directions. This solves the problem that the diffraction light corresponding to different regions on the boundary line of the light-transmitting hole may overlap and interfere with each other along a same direction to increase the diffraction phenomenon. In such way, the diffraction phenomenon of the spot formed by passing light through the light-transmitting hole may be reduced.

In the display panel provided in the embodiments of the present disclosure, the centers of all light-transmitting holes in each light-transmitting hole group may be distributed along a ring shape, such that diffraction spots formed by adjacent light-transmitting holes may overlap and interfere with each other along different directions, thereby preventing diffraction spots formed by adjacent light-transmitting holes from overlapping and interfering with each other along a same direction and reducing the diffraction phenomenon of the spots formed by passing light through the light-transmitting hole combination region.

In the display panel provided in the embodiments of the present disclosure, the second display region may further include a plurality of pixels and a plurality of pixel drive circuits. Pixel drive circuits used for driving pixels in the light-transmitting hole combination region may be first pixel drive circuits. At least a portion of the first pixel drive circuits may be located at a region outside the light-transmitting hole combination region. At least a portion of the pixel drive circuits in the pixel drive circuits for driving the pixels in the light-transmitting hole combination region may be disposed at the region outside the light-transmitting hole combination region, thereby increasing the area used for transmitting light at the light-transmitting hole combination region and improving the light transmittance of the light-transmitting hole combination region.

Figure 4:
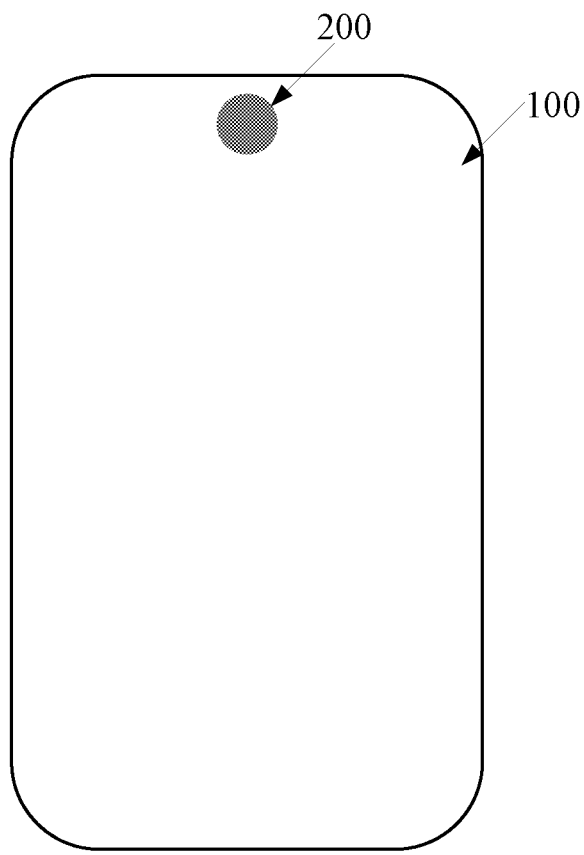
FIG. 4 illustrates a top view of a display panel according to embodiments of the present disclosure.
Figure 5:
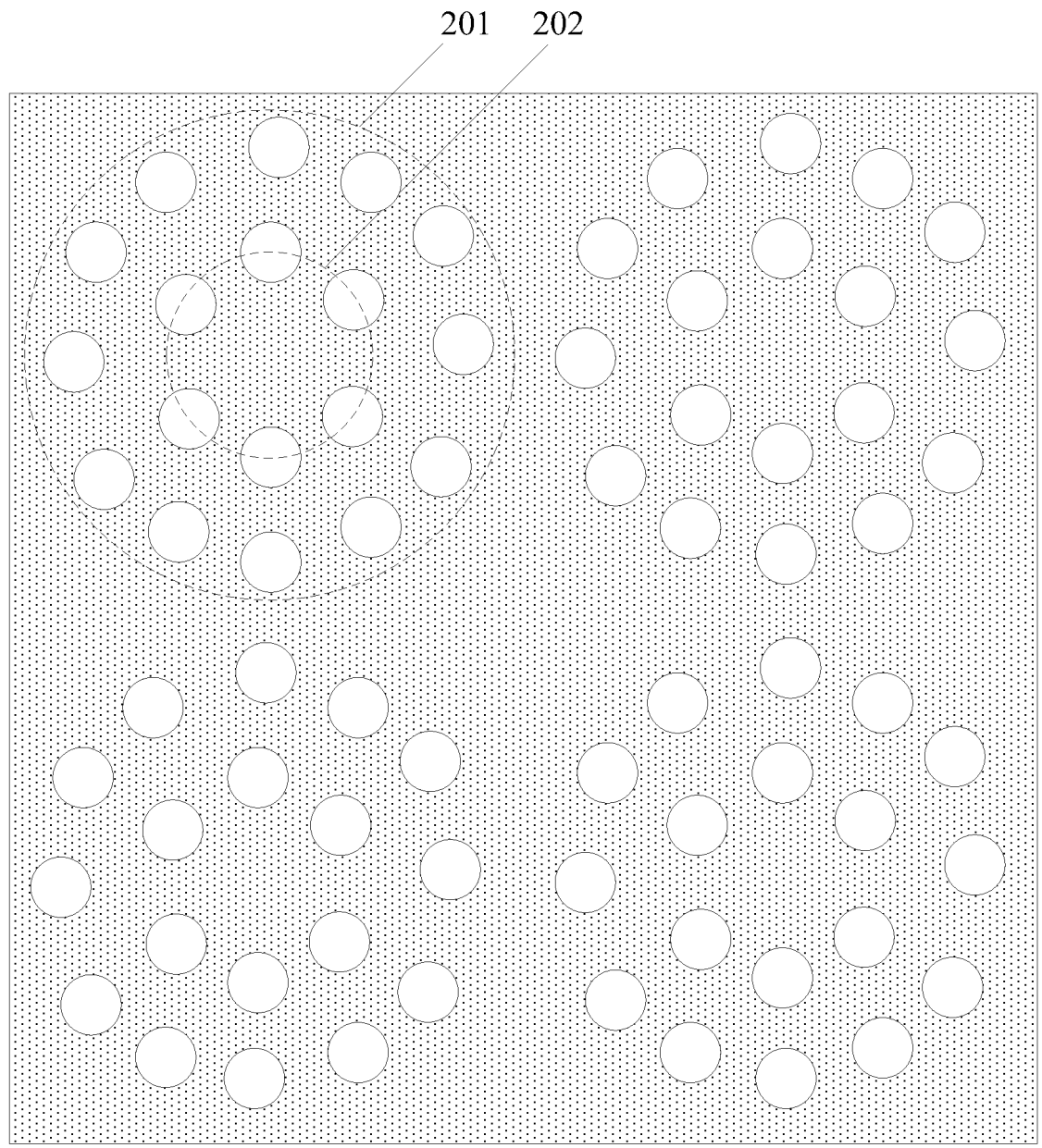
FIG. 5 illustrates a local schematic of a second display region in a display panel according to embodiments of the present disclosure.

The present disclosure provides a display panel. As shown in FIG. 4, the display panel may include a first display region 100 and a second display region 200. As shown in FIG. 5, the second display region 200 may include a plurality of light-transmitting hole combination regions 201. At least one light-transmitting hole group 202 may be disposed at each light-transmitting hole combination region 201. Each light-transmitting hole group 202 may include a plurality of light-transmitting holes. The boundary line of each light-transmitting hole may be a closed arc, such that diffraction light corresponding to different regions on the boundary line of the light-transmitting hole may overlap and interfere with each other along different directions. This solves the problem that the diffraction light corresponding to different regions on the boundary line of the light-transmitting hole may overlap and interfere with each other along a same direction to increase the diffraction phenomenon. In such way, the diffraction phenomenon of the spot formed by passing light through the light-transmitting hole may be reduced.

Figure 6:
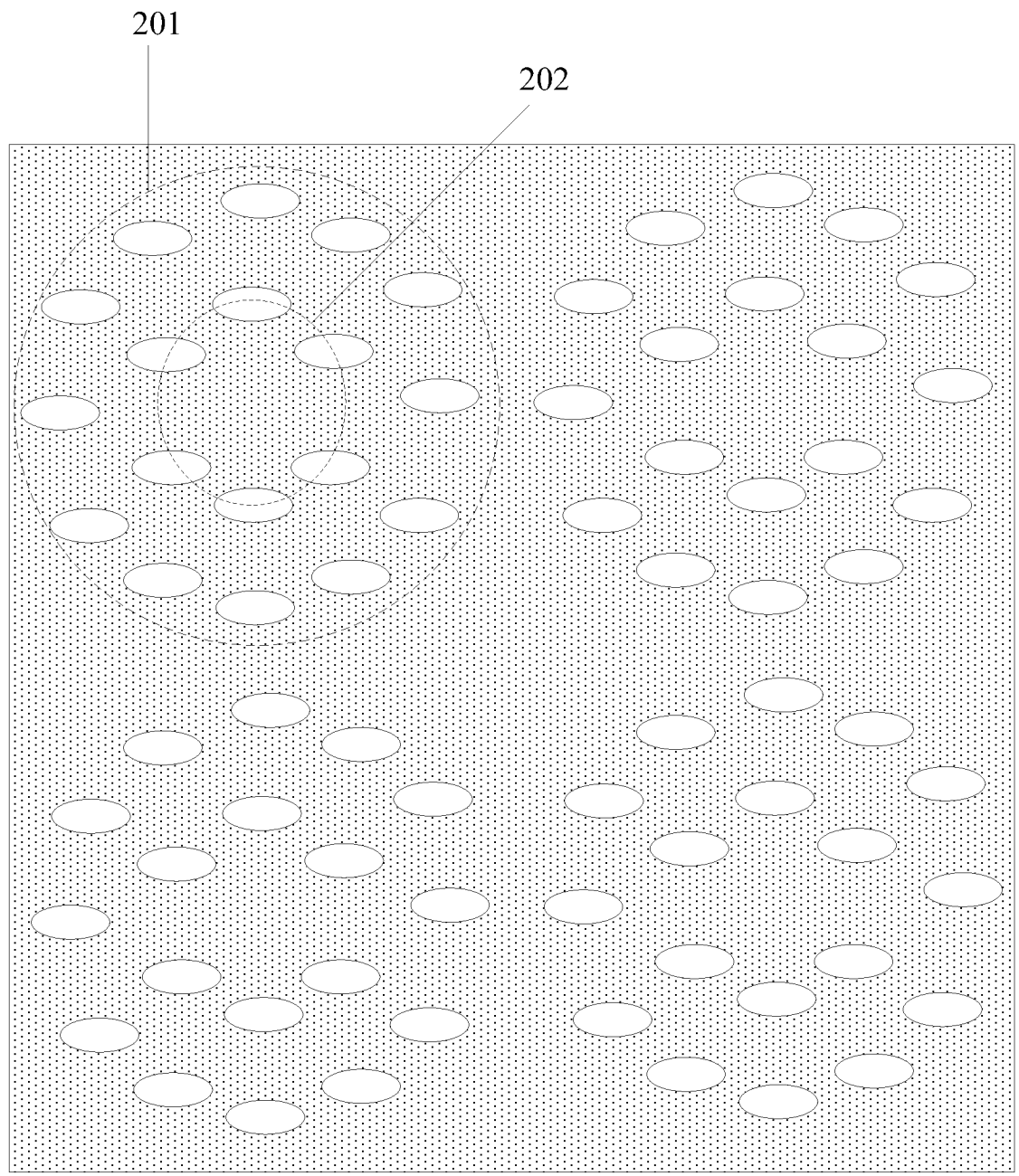
FIG. 6 illustrates another local schematic of a second display region in a display panel according to embodiments of the present disclosure.

Optionally, based on the above-mentioned embodiments, the boundary line of the light-transmitting hole shown in FIG. 5 may be a circle in one embodiment of the present disclosure; the boundary line of the light-transmitting hole shown in FIG. 6 may be an ellipse in another embodiment of the present disclosure; and the boundary line of the light-transmitting hole may also be other closed arc, which may not be limited herein according to the embodiments of the present disclosure.

The boundary line of the light-transmitting hole may be a circle, used as an example to describe the display panel provided in the embodiments of the present disclosure hereinafter.

In the display panel provided in the embodiments of the present disclosure, the centers of all light-transmitting holes in each light-transmitting hole group 202 may be distributed along a ring shape, such that diffraction spots formed by adjacent light-transmitting holes may overlap and interfere with each other along different directions, thereby preventing diffraction spots formed by adjacent light-transmitting holes from overlapping and interfering with each other along a same direction and reducing the diffraction phenomenon of the spots formed by passing light through the light-transmitting hole combination region 201.

Figure 7:
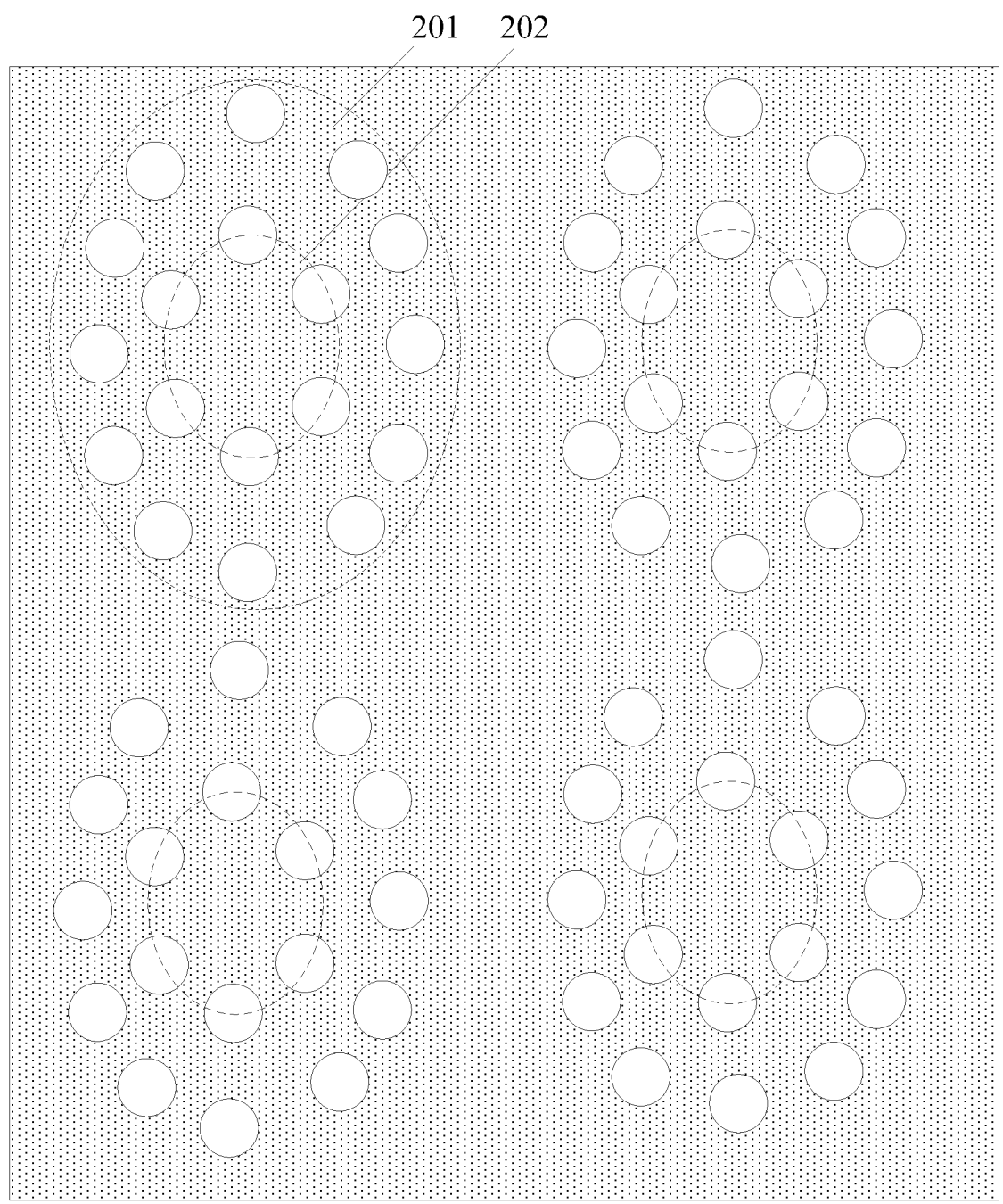
FIG. 7 illustrates another local schematic of a second display region in a display panel according to embodiments of the present disclosure.

Optionally, based on the above-mentioned embodiments, the ring shape shown in FIG. 5 may be a circle in one embodiment of the present disclosure. In such way, the light interaction between any two adjacent light-transmitting holes in each light-transmitting hole group 202 may be essentially same, thereby improving the brightness uniformity of regions where different light-transmitting holes are located after the light passes through the light-transmitting hole combination region 201. However, the ring shape may not be limited in the embodiments of the present disclosure. In other embodiments of the present disclosure, the ring shape shown in FIG. 7 may be an ellipse. As long as the centers of all light-transmitting holes in each light-transmitting hole group 202 are distributed along a ring shape, the diffraction phenomenon of the formed spots after light passes through the light-transmitting hole combination region 201 may be reduced.

The ring shape may be the circle, used as the example to describe the display panel provided in the embodiments of the present disclosure hereinafter.

In the display panel provided in the embodiments of the present disclosure, the second display region may further include a plurality of pixels and a plurality of pixel drive circuits. Pixel drive circuits used for driving pixels 10 in the light-transmitting hole combination region 201 may be first pixel drive circuits 20. At least a portion of the first pixel drive circuits 20 may be located at a region outside the light-transmitting hole combination region 201. At least a portion of the pixel drive circuits in the pixel drive circuits for driving the pixels 10 in the light-transmitting hole combination region 201 may be disposed at the region outside the light-transmitting hole combination region 201, thereby increasing the area used for transmitting light at the light-transmitting hole combination region 201 and improving the light transmittance of the light-transmitting hole combination region 201.

Figure 8:
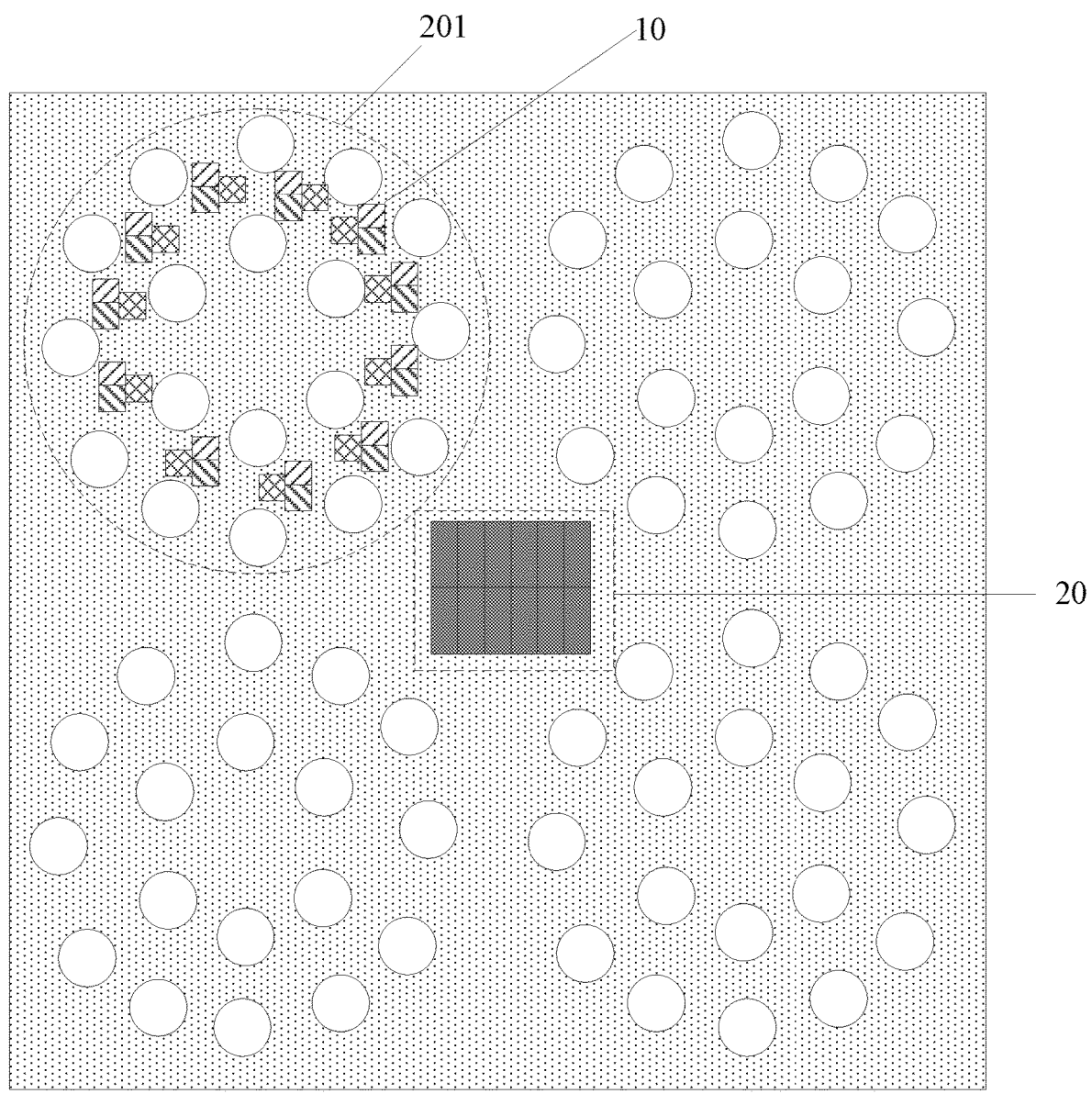
FIG. 8 illustrates another local schematic of a second display region in a display panel according to embodiments of the present disclosure.

Optionally, based on the above-mentioned embodiments, all first pixel drive circuits 20, as shown in FIG. 8, may be located at a region outside the light-transmitting hole combination region 201. That is, the pixel drive circuits of all pixels in the light-transmitting hole combination region 201 may all be located at a region outside the light-transmitting hole combination region 201, such that the influence of the pixel drive circuits of all pixels in the light-transmitting hole combination region 201 on the light transmittance of the light-transmitting hole combination region 201 may be minimized.

Figure 9:
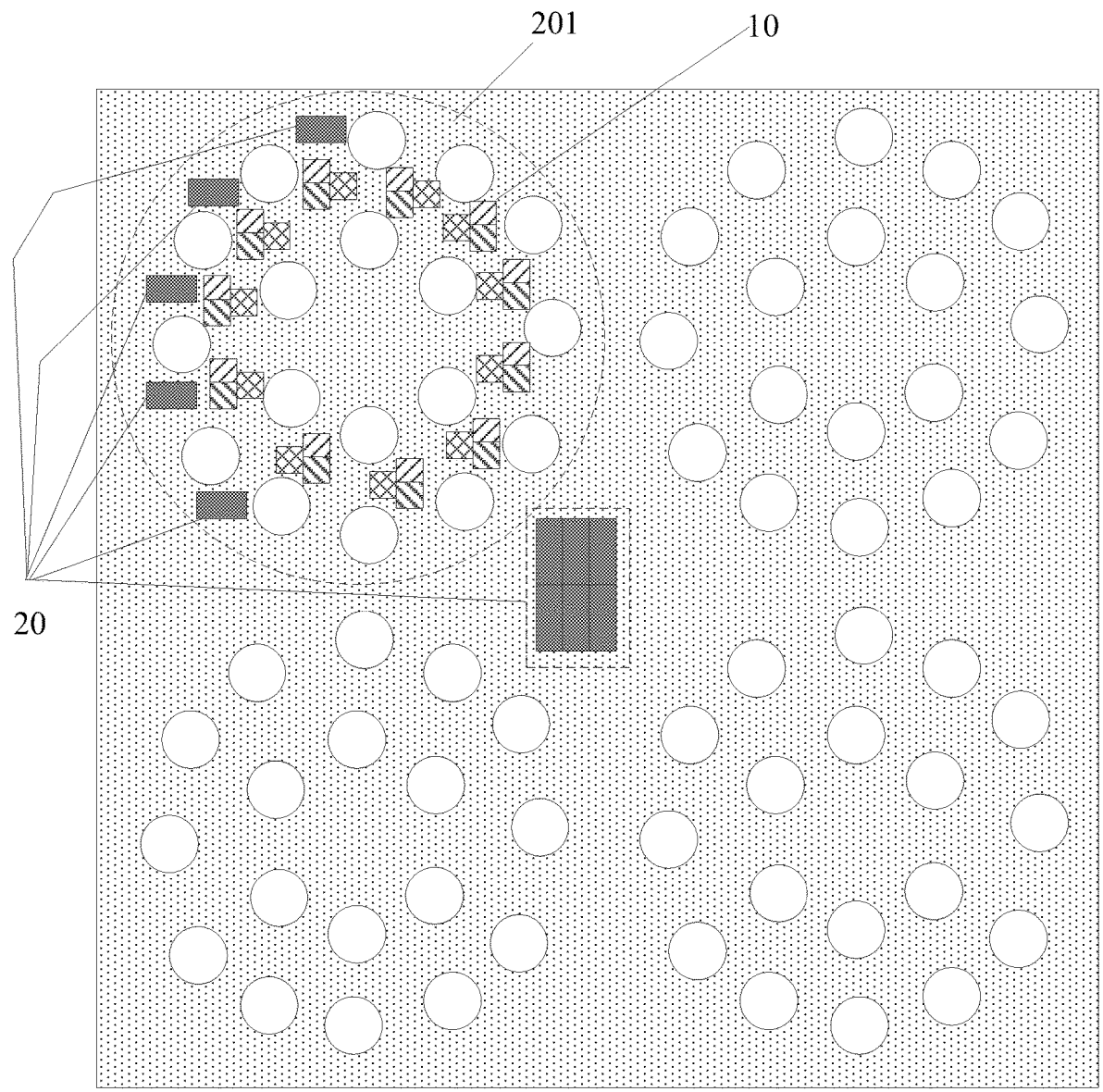
FIG. 9 illustrates another local schematic of a second display region in a display panel according to embodiments of the present disclosure.

The longer the distance between a pixel drive circuit and a pixel driven by the pixel drive circuit is, the longer the electrical connection line between the pixel drive circuit and the pixel corresponding to the pixel drive circuit is, and the higher the signal strength attenuation when the drive signal outputted by the pixel drive circuit is transmitted to the pixel is. Therefore, in another embodiment of the present disclosure, as shown in FIG. 9, at least a portion of the first pixel drive circuits 20 may be located at a region outside the light-transmitting hole combination region 201, and at least a portion of the first pixel drive circuits 20 may be located at a region inside the light-transmitting hole combination region 201. That is, in the pixel drive circuits of all pixels in the light-transmitting hole combination region 201, a portion of the pixel drive circuits may be located at a region outside the light-transmitting hole combination region 201, and a portion of the pixel drive circuits may be located at a region inside the light-transmitting hole combination region 201. Therefore, both the light transmittance in the light-transmitting hole combination region 201 and the wiring length between the pixel drive circuit and the pixel driven by the pixel drive circuit may be taken into account, which may not be limited at the embodiments of the present disclosure herein.

Figure 10:
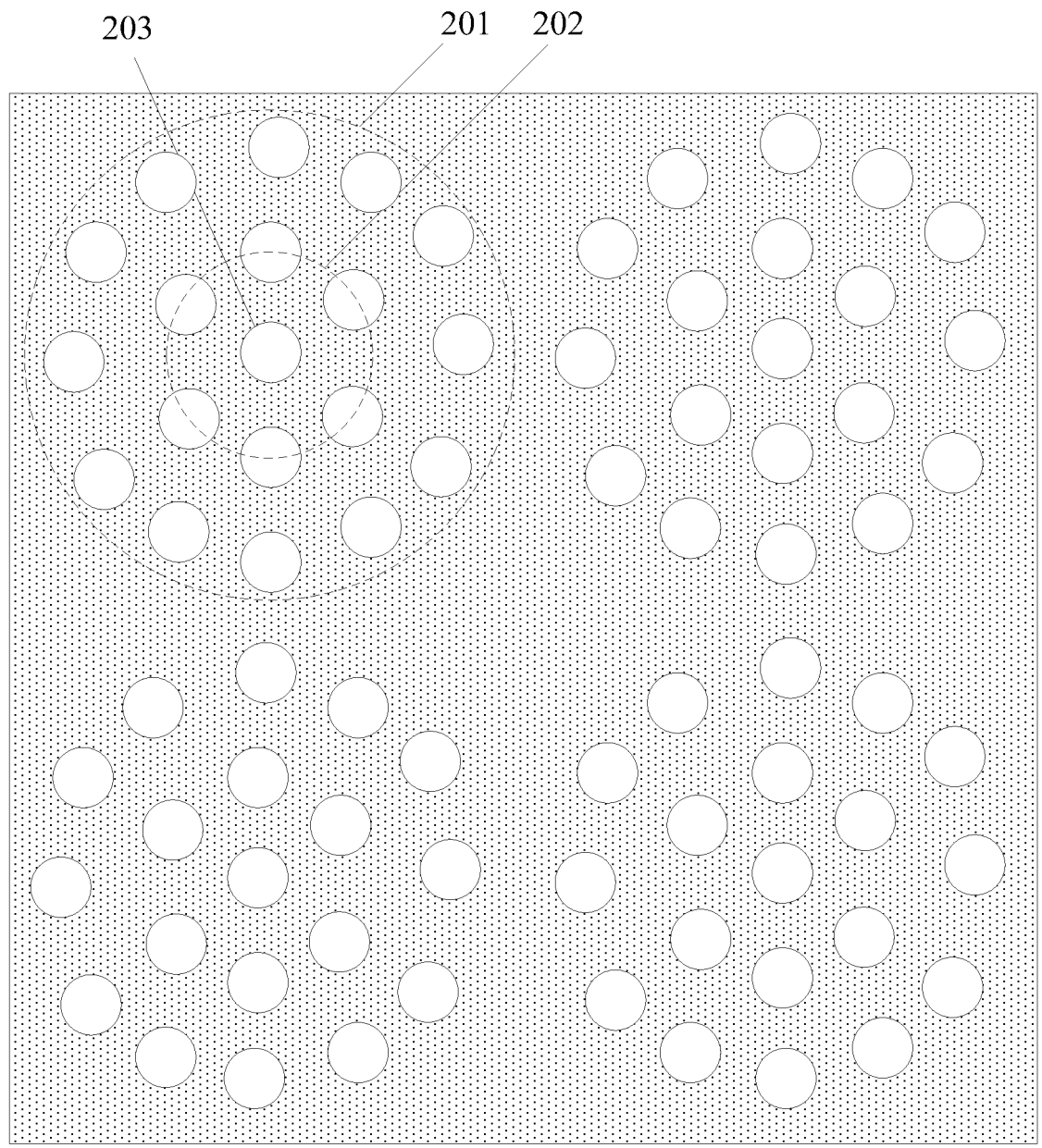
FIG. 10 illustrates another local schematic of a second display region in a display panel according to embodiments of the present disclosure.

Based on the above-mentioned embodiments, in one embodiment of the present disclosure, the light-transmitting hole combination region 201 shown in FIG. 10 may further include a central light-transmitting hole 203. The central light-transmitting hole 203 may be located at the central region of the ring shape, such that the spot formed by passing light through the central light-transmitting hole 203 and the spots formed by passing light through all light-transmitting holes in the light-transmitting hole group 202 may interact with each other along different directions, thereby further improving the diffraction phenomenon of the formed spot after the light passes through the light-transmitting hole combination region 201.

Furthermore, in the embodiments of the present disclosure, the central light-transmitting hole 203 may be located at the central region of the ring shape, which may enable the interaction, between the spot corresponding to the central light-transmitting hole 203 and the spots corresponding to different light-transmitting holes in the light-transmitting hole group 202, to be substantially same, thereby further improving the brightness uniformity of different regions in the formed spot after the light passes through the light-transmitting combination region 201.

Based on the above-mentioned embodiments, in one embodiment of the present disclosure, at least two light-transmitting hole groups 202 may be disposed at each light-transmitting hole combination region 201 and different light-transmitting hole groups 202 may be nested shown in FIG. 10, such that the diffraction spots formed by adjacent light-transmitting hole groups 202 may overlap and interfere with each other along different directions, thereby preventing diffraction spots of adjacent light-transmitting hole groups 202 from overlapping and interfering with each other along a same direction and further reducing the diffraction phenomenon of the spot formed after the light passes through the second display region 200.

Optionally, based on the above-mentioned embodiments, in one embodiment of the present disclosure, the centers of all light-transmitting hole groups 202 in each light-transmitting hole combination region 201 may coincide, which may enable the interaction, between the diffraction spots corresponding to the light-transmitting holes at different positions in adjacent light-transmitting hole groups 202, to be substantially same, thereby further improving the diffraction phenomenon of the formed spot after the light passes through the second display region and also improving the brightness uniformity of different regions in the formed spot after the light passes through the second display region.

Based on the above-mentioned embodiments, in one embodiment of the present disclosure, at least two light-transmitting hole groups 202 may be disposed at each light-transmitting hole combination region 20. As shown in FIG. 10, at least two light-transmitting hole groups 202 may include a first light-transmitting hole group and a second light-transmitting hole group, where a distance between each light-transmitting hole in the first light-transmitting hole group and the central light-transmitting hole 203 may be greater than a distance between each light-transmitting hole in the second light-transmitting hole group and the central light-transmitting hole 203, and a quantity of the light-transmitting holes in the first light-transmitting hole group may be greater than a quantity of the light-transmitting holes in the second light-transmitting hole group. Optionally, the sizes of all light-transmitting holes in the first light-transmitting hole group and the second light-transmitting hole group may be same, which may enable the interaction, between any two adjacent light-transmitting holes in a same light-transmitting hole combination region 201, to be same, thereby improving the brightness uniformity of different regions in the formed spot after the light passes through the light-transmitting hole combination region 201, increasing the directivity of adjacent spots, overlapping and interfering with each other in different directions, along a same circular direction in the light-transmitting hole combination region 201, and further improving the diffraction phenomenon of the light-transmitting hole combination region 201.

It should be noted that the above-mentioned embodiments are described using at least two light-transmitting hole groups 202, which include the first light-transmitting hole group and the second light-transmitting hole group, as an example, which may not be limited according to the embodiments of the present disclosure. In other embodiments of the present disclosure, at least two light-transmitting hole groups 202 may also include at least three light-transmitting hole groups 202, as long as it may ensure that, in the at least two light-transmitting hole groups 202, the longer the distance from the central light-transmitting hole is, the greater the quantity of light-transmitting holes included in one light-transmitting group 202 is.

Figure 11:
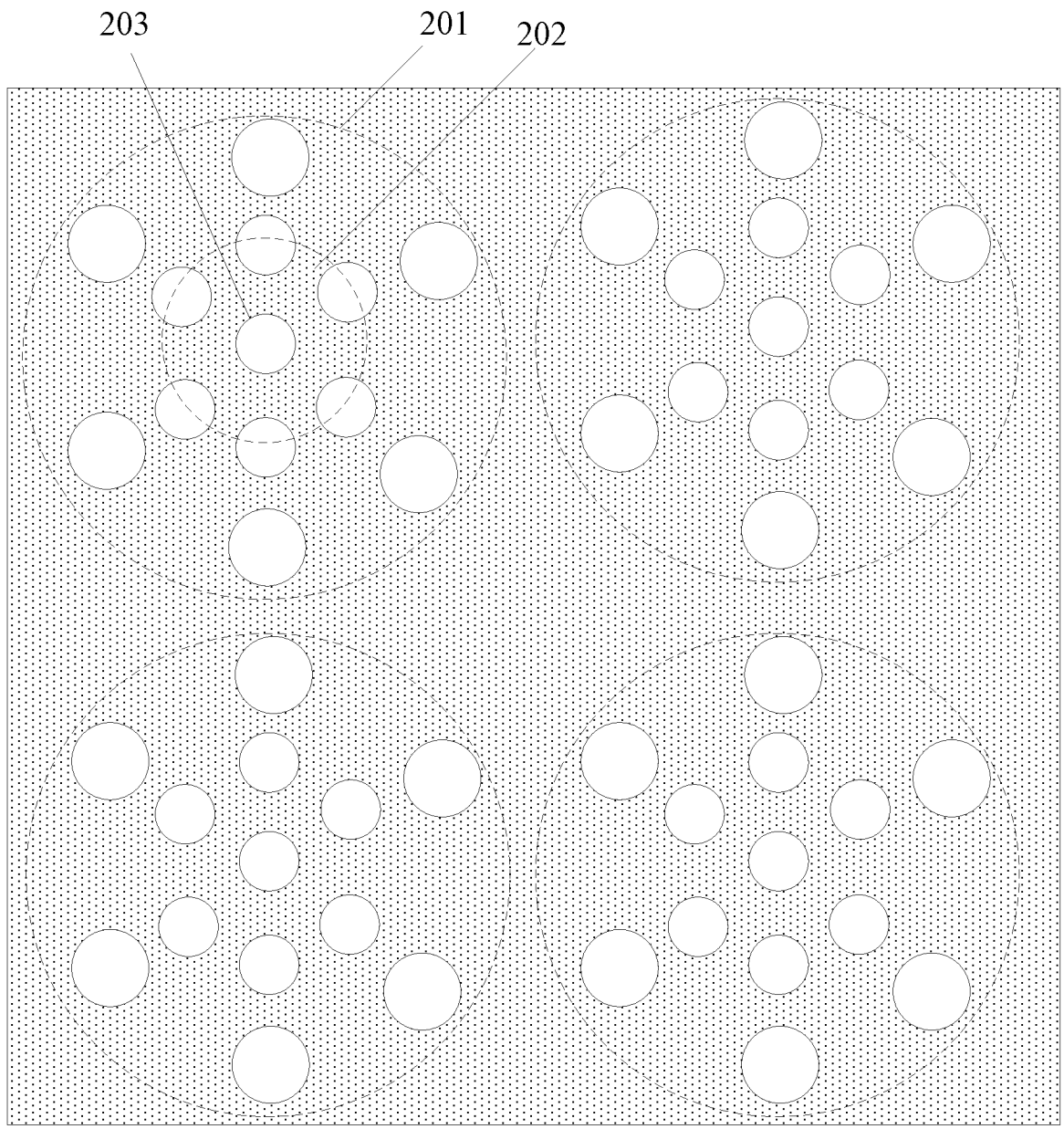
FIG. 11 illustrates another local schematic of a second display region in a display panel according to embodiments of the present disclosure.

It should also be noted that the above-mentioned embodiments are described using the same size of each light-transmitting hole in different light-transmitting hole groups 202 in the light-transmitting hole combination region 201 as an example, which may not be limited according to the embodiments of the present disclosure. In other embodiments of the present disclosure, the sizes of the light-transmitting holes in different light-transmitting hole groups 202 may also be different. Optionally, in one embodiment of the present disclosure, as shown in FIG. 11, the sizes of the light-transmitting holes in different light-transmitting hole groups 202 in the light-transmitting hole combination region 201 may be different, and the quantities of the light-transmitting holes in different light-transmitting hole groups 202 may be same, which may not be limited according to the embodiments of the present disclosure.

Based on the above-mentioned embodiments, in one embodiment of the present disclosure, the light-transmitting hole may be a circle shape, and the diameter range of the light-transmitting hole may be from 80 micrometers to 150 micrometers, including an endpoint value, to avoid a significant large diameter of the light-transmitting hole. The direction quantity for overlapping and interfering along different directions of adjacent spots along a same circular direction in the light-transmitting hole combination region 201 may be relatively small, such that the light diffraction phenomenon of the light-transmitting hole combination region 201 may be further reduced. In addition, the diameter of the light-transmitting hole may be avoided to be too small which may increase the process difficulty of the light-transmitting hole. The above-mentioned diameter range may not be limited according to the embodiments of the present disclosure.

Based on the above-mentioned embodiments, in one embodiment of the present disclosure, the distance range between adjacent light-transmitting holes in the light-transmitting hole combination region 201 may be from 90 micrometers to 170 micrometers, including an endpoint value. Such distance range may avoid the distance between adjacent light-transmitting holes being too large, which may reduce the overlapping region of the spots of adjacent light-transmitting holes and affect the brightness uniformity of different regions in the spot when the light passes through the light-transmitting hole combination region 201. Meanwhile, the distance between adjacent light-transmitting holes may be avoided to be too small which may increase the process difficulty. The above-mentioned distance range may not be limited according to the embodiments of the present disclosure.

Figure 12:
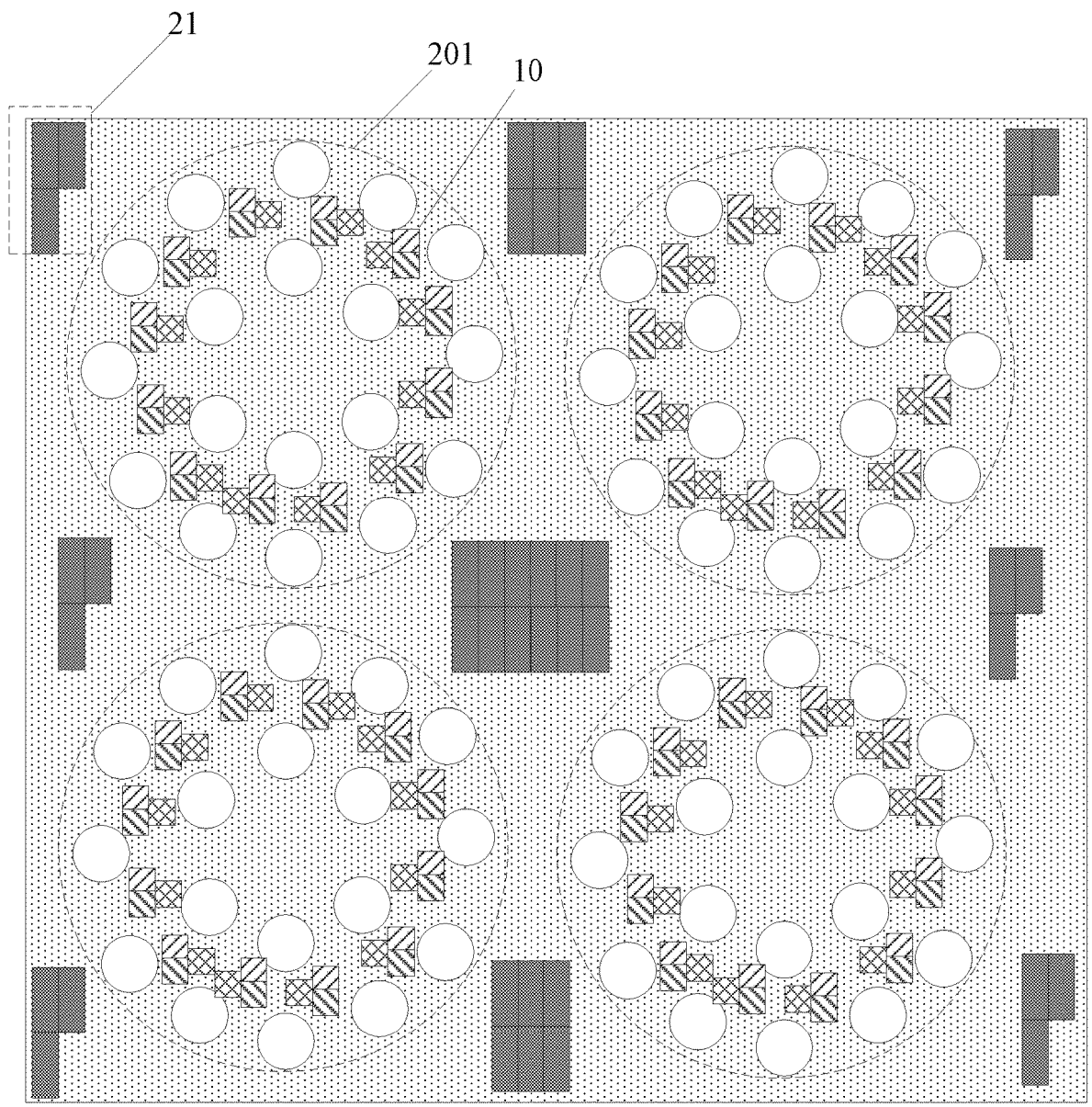
FIG. 12 illustrates another local schematic of a second display region in a display panel according to embodiments of the present disclosure.

Based on the above-mentioned embodiments, in one embodiment of the present disclosure, the first pixel drive circuit, as shown in FIG. 12, may include a plurality of first sub-pixel drive circuit groups 21, and the first sub-pixel drive circuit group 21 may include at least two pixel drive circuits. The plurality of first sub-pixel drive circuit groups 21 may be evenly disposed around the light-transmitting hole combination region 201 to avoid that the plurality of first sub-pixel drive circuit groups 21 are concentratedly disposed at one position which may result in an excessively large non-light-transmitting area at such position to generate grainy display pictures. Meanwhile, each first sub-pixel drive circuit group 21 may be disposed as close as possible to the pixel driven by the first sub-pixel drive circuit group 21, such that the length of the electrical connection line between each pixel and the pixel drive circuit corresponding to the pixel may be reduced, there by facilitating the wiring of the light-transmitting hole combination region 201.

Based on the above-mentioned embodiments, in one embodiment of the present disclosure, the second display region, as shown in FIG. 12, may include a plurality of light-transmitting hole combination regions 201 arranged in a matrix. In the embodiments of the present disclosure, the plurality of the first sub-pixel drive circuit groups 21 may be evenly disposed at gaps between two light-transmitting hole combination regions 201 adjacent to the plurality of the first sub-pixel drive circuit groups 21. In such way, the plurality of the first sub-pixel drive circuit groups 21 may be evenly distributed along the second display region, thereby enabling the distances between all first sub-pixel drive circuit groups and the pixels driven by the first sub-pixel drive circuit groups to be substantial same, which may reduce the probability where different lengths of the electrical connection lines between all pixels and the pixel drive circuits corresponding to the pixels may result in different brightness of the display pictures.

Figure 13:
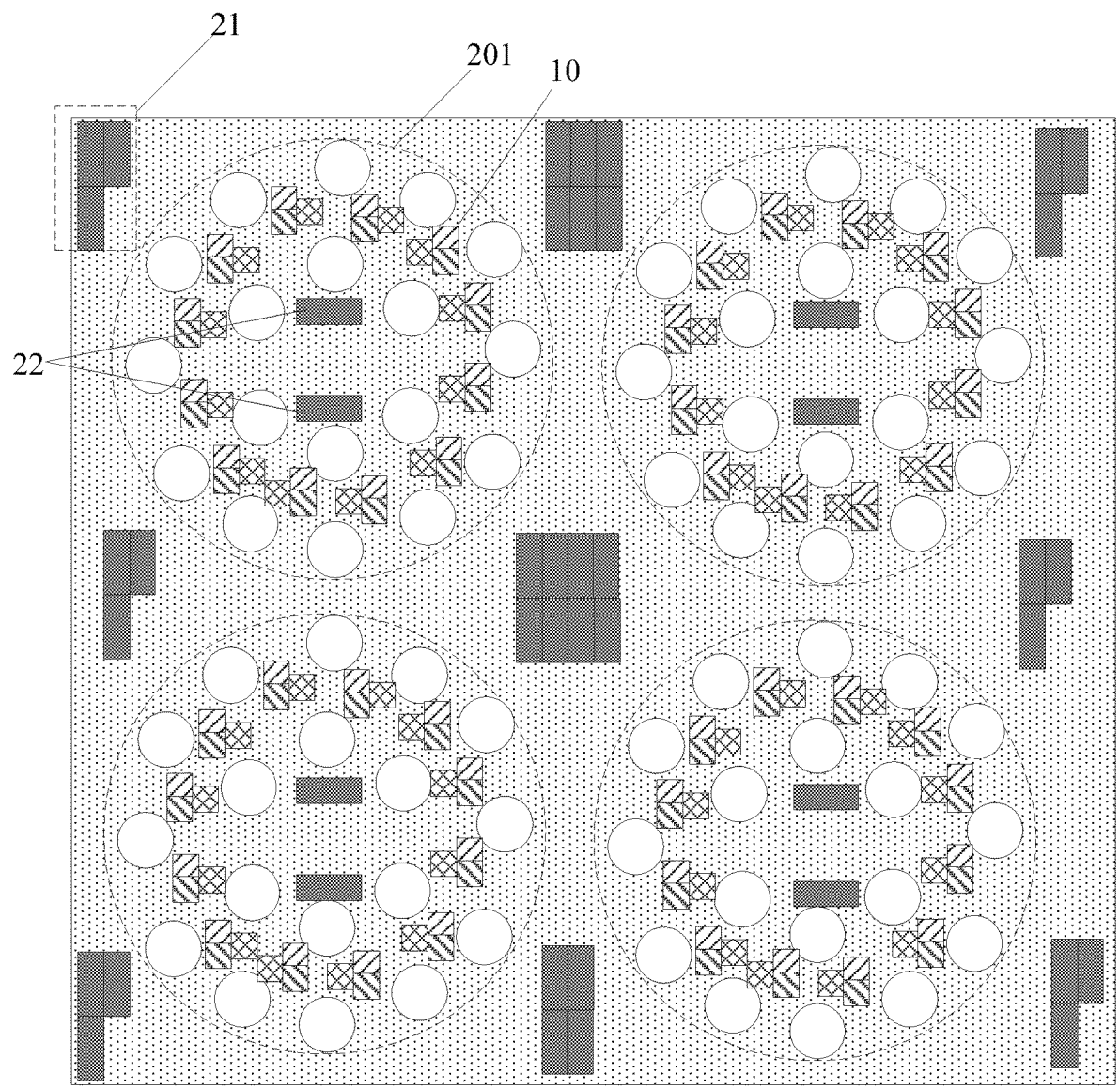
FIG. 13 illustrates another local schematic of a second display region in a display panel according to embodiments of the present disclosure.

Based on the above-mentioned embodiments, in one embodiment of the present disclosure, the first pixel drive circuit, as shown in FIG. 13, may further include a plurality of second sub-pixel drive circuit groups 22, and the second sub-pixel drive circuit group 22 may include at least one pixel drive circuit, which may be disposed at a region inside the light-transmitting hole combination region 201. In such way, the distance between the second sub-pixel drive circuit group and the pixel corresponding to the second sub-pixel drive circuit group may be reduced, and all pixel drive circuits of the pixels in the second display region may be avoided to be disposed at regions outside of the light-transmitting hole combination region 201, which may result in large gaps between adjacent light-transmitting hole combination regions 201 and affect the display quality of the second display region.

Figure 14:
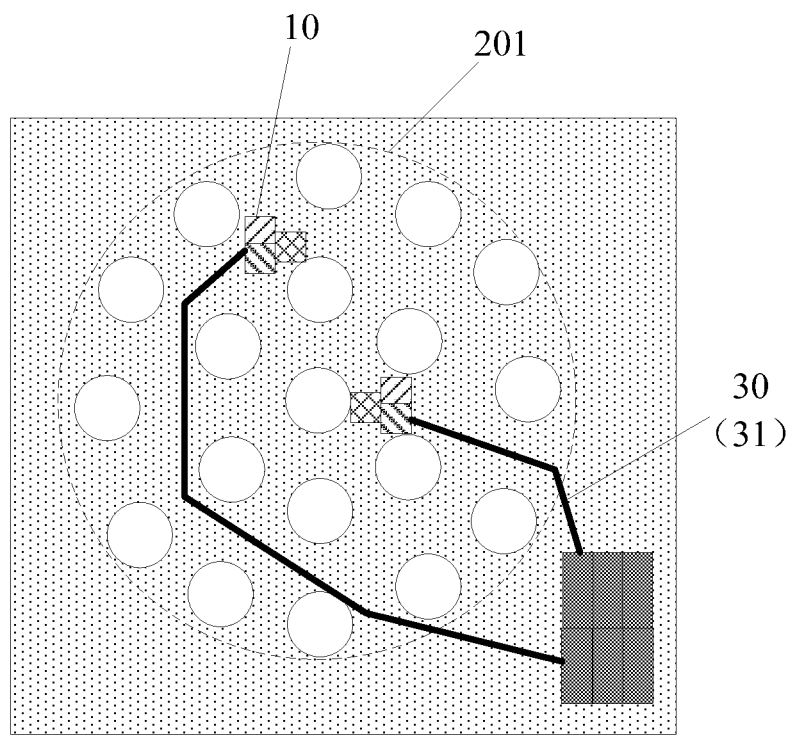
FIG. 14 illustrates another local schematic of a second display region in a display panel according to embodiments of the present disclosure.

Based on the above-mentioned embodiments, in one embodiment of the present disclosure, the second display region, as shown in FIG. 14, may further include an electrical connection line 30 which is electrically connected to the pixel 10 and the pixel drive circuit, thereby implementing the electrical connection between the pixel 10 and the pixel drive circuit corresponding to the pixel 10.

Optionally, based on the above-mentioned embodiments, in one embodiment of the present disclosure, the electrical connection line 30, as shown in FIG. 14, may include a metal wiring 31. The metal wiring 31 may be located in a region other than the light-transmitting holes in the light-transmitting hole combination region 201, which may prevent the setting of the electrical connection line 30 from affecting the light transmittance of all light-transmitting holes in the light-transmitting hole combination region 201 and reducing the resistivity of the electrical connection line 30, thereby reducing the signal attenuation at the location where the drive signal outputted by the pixel drive circuit is transmitted to the pixel.

Figure 15:
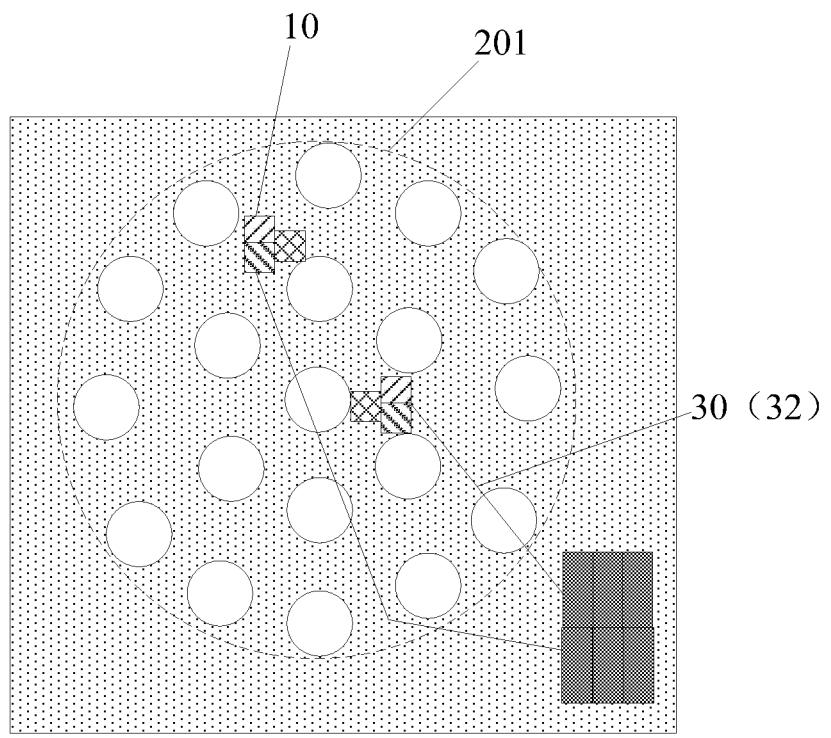
FIG. 15 illustrates another local schematic of a second display region in a display panel according to embodiments of the present disclosure.

Based on the above-mentioned embodiments, in another embodiment of the present disclosure, the electrical connection line 30, as shown in FIG. 15, may include a transparent conductive wiring 32. At least a portion of the transparent conductive wiring 32 may be located at a region of the light-transmitting holes in the light-transmitting hole combination region 201. In such way, setting the electrical connection line 30 may be facilitated, the difficulty of wiring the electrical connection line 30 to bypass the region of the light-transmitting holes may be reduced, and the length of the electrical connection line 30 may be reduced, thereby facilitating the transmission of a drive signal outputted by the pixel drive circuit to the pixel corresponding to the pixel drive circuit.

Figure 16:
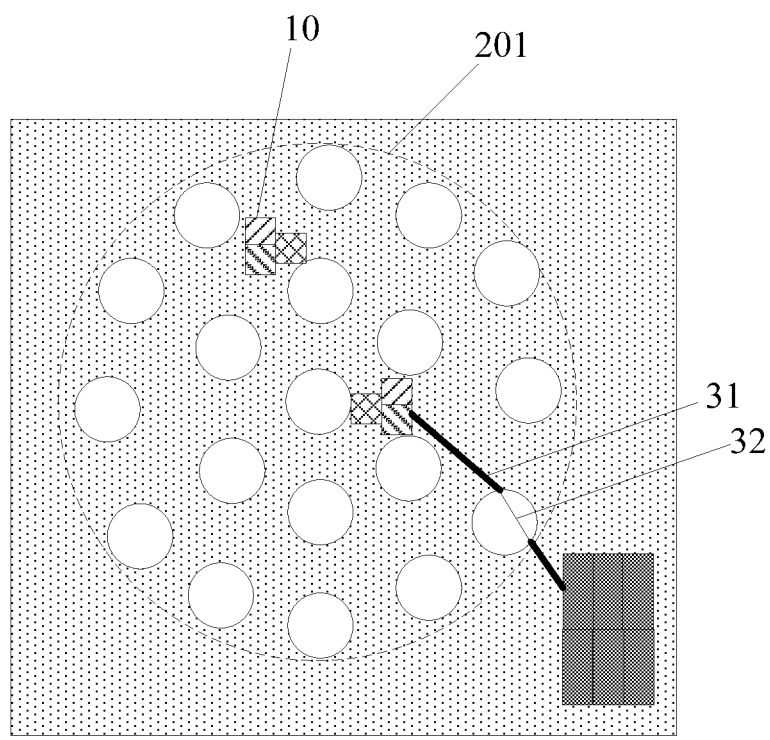
FIG. 16 illustrates another local schematic of a second display region in a display panel according to embodiments of the present disclosure.

In another embodiment of the present disclosure, as shown in FIG. 16, the electrical connection line may include the metal wiring 31 and the transparent conductive wiring 32 electrically connected to the metal wiring 31, which may take into account both the resistivity and the length of the electrical connection line. The metal wiring 31 may be at a region outside the light-transmitting holes in the light-transmitting combination region 201, thereby avoid the setting of the electrical connection line from affecting the light transmittance of each light-transmitting hole in the light-transmitting hole combination region 201 and reducing the resistivity of the electrical connection line. Meanwhile, at least a portion of the transparent conductive wiring 32 may be located at a region of the light-transmitting holes in the light-transmitting hole combination region 201. In such way, setting the electrical connection line 30 may be facilitated, the difficulty of wiring the electrical connection line 30 to bypass the region of the light-transmitting holes may be reduced, and the length of the electrical connection line 30 may be reduced.

Figure 17:
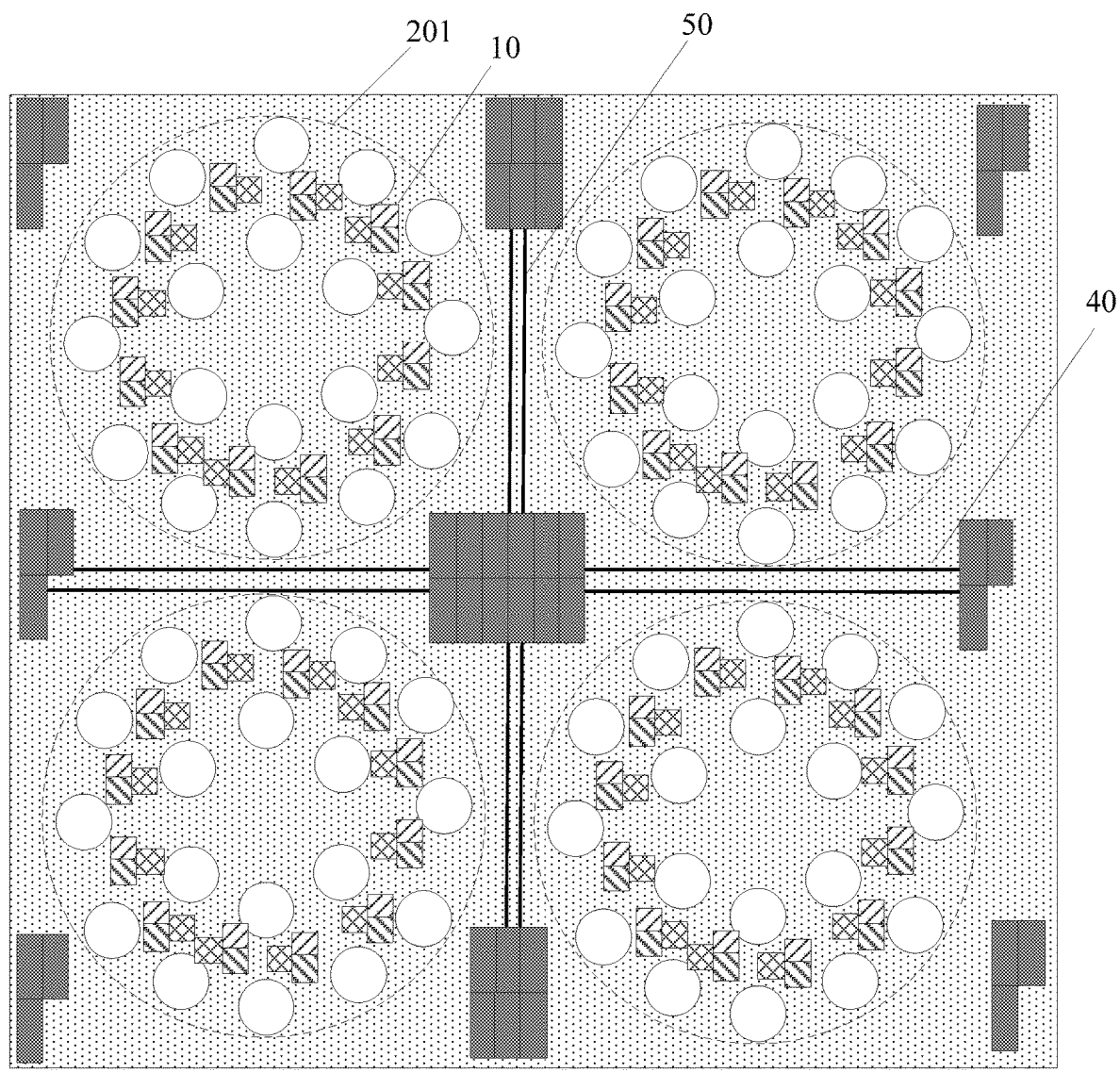
FIG. 17 illustrates another local schematic of a second display region in a display panel according to embodiments of the present disclosure.

Based on the above-mentioned embodiments, in one embodiment of the present disclosure, the display panel, as shown in FIG. 17, may include a plurality of scan lines 40 arranged along a first direction, and the scan lines 40 may be configured to provide scan signals to the pixel drive circuits. Optionally, the scan lines 40 may be located at a region outside the light-transmitting hole combination region 201 in the second display region, and may pass through gaps between adjacent light-transmitting hole combination regions 201 arranged along a second direction, which may avoid the setting of the scan lines 40 from affecting the light transmittance of the light-transmitting hole combination region 201.

Based on the above-mentioned embodiments, in another embodiment of the present disclosure, the display panel, as shown in FIG. 17, may include a plurality of data lines 50 arranged along the second direction, and the data lines 50 may be configured to provide data signals to the pixel drive circuits. Optionally, the data lines 50 may be located at a region outside the light-transmitting hole combination region 201 in the second display region, and may pass through gaps between adjacent light-transmitting hole combination regions 201 arranged along the first direction, which may avoid the setting of the data lines 50 from affecting the light transmittance of the light-transmitting hole combination region 201.

Figure 18:
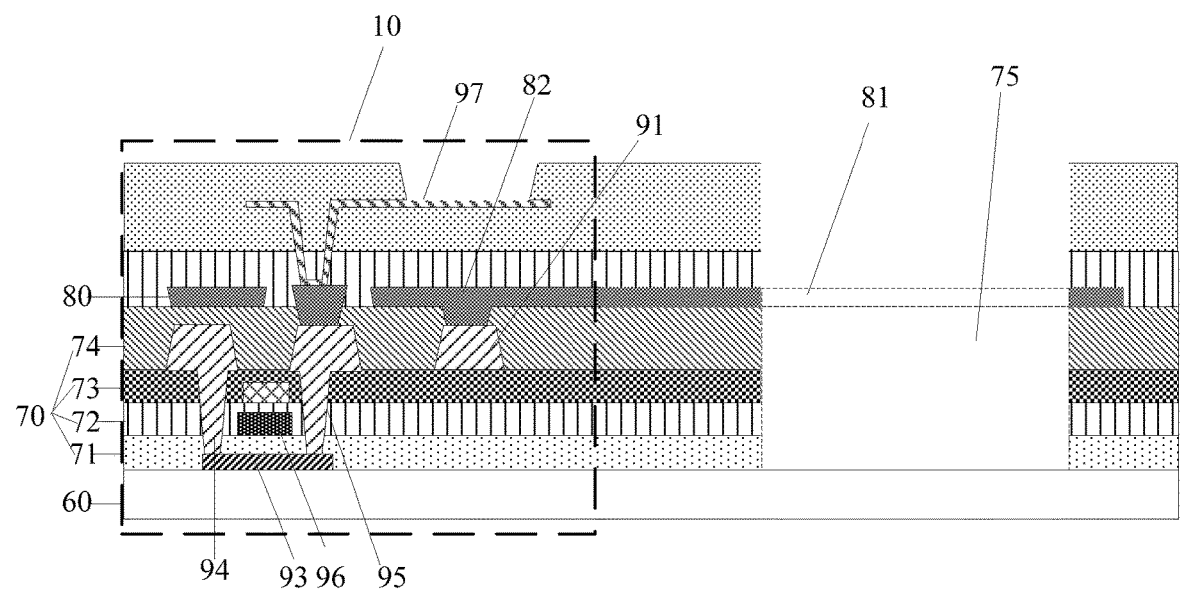
FIG. 18 illustrates a local cross-sectional view of a second display region in a display panel according to embodiments of the present disclosure.

Based on the above-mentioned embodiments, in one embodiment of the present disclosure, the display panel, as shown in FIG. 18, may further include:

a support element 60;
a multi-layer insulating layer 70 on a first side surface of the support element 60, where the multi-layer insulating layer 70 may include at least one organic insulating layer and at least one inorganic insulating layer, and a portion of the multi-layer insulating layer 70 corresponding to the light-transmitting hole combination region 201 may have a plurality of first through holes 75 passing through the organic insulating layer; and
a metal light-shielding layer 80 on a side of the multi-player insulating layer 70 away from the support element 60, where a portion of the metal light-shielding layer 80 corresponding to the light-transmitting hole combination region 201 may have a plurality of second through holes 81 passing through the metal light-shielding layer 80.

The first through holes 75 may have a one-to-one correspondence with the second through holes 81, which may form the light-transmitting holes of the second display region.

Optionally, based on the above-mentioned embodiments, the first through hole 75 may not only pass through the organic insulating layer in the multi-layer insulating layer 70 but also the inorganic insulating layer in the multi-layer insulating layer 70. That is, the first through hole 75 may pass through the multi-layer insulating layer 70 to increase the light transmittance of a portion of the multi-layer insulating layer 70 corresponding to the light-transmitting hole combination region, which may not be limited according to the embodiments of the present disclosure. In other embodiments of the present disclosure, if the inorganic insulating layer of the multi-layer insulating layer 70 has a high light transmittance, the first through hole 75 may also pass through only the organic insulating layer in the multi-layer insulating layer 70, but not the inorganic insulating layer in the multi-layer insulating layer 70, which may be determined according to actual requirements.

For example, in one embodiment of the present disclosure, the support element 60 may be a support substrate, such as a glass substrate, or may be a support thin film, such as an organic film, which may not be limited according to the embodiments of the present disclosure.

Based on the above-mentioned embodiments, in one embodiment of the present disclosure, a portion of the support element 60 corresponding to the second display region may have a plurality of third through holes passing through the support element 60. The first through holes, the second through holes, and the third through holes may have a one-to-one correspondence with each other, which may form the light-transmitting holes of the second display region, thereby further improving the light transmittance of the second display region, which may not be limited according to the embodiments of the present disclosure. In other embodiments of the present disclosure, the third through holes may not be disposed in the support element to prevent the setting of the third through holes from affecting the service life of the thin-film transistor between the support element and the metal light-shielding layer, which may be determined according to actual requirements.

Based on the above-mentioned embodiments, a buffer layer (not shown in FIG. 18) may be disposed between the support element 60 and the multi-layer insulating layer 70. In one embodiment of the present disclosure, the buffer layer may have fourth through holes. The forth through holes, the first through holes, and the second through holes may have a one-to-one correspondence with each other, which may form the light-transmitting holes of the second display region, thereby further improving the light transmittance of the second display region, which may not be limited according to the embodiments of the present disclosure. In other embodiments of the present disclosure, if the buffer layer has a high light transmittance, the fourth through holes may not be disposed in the buffer layer, which may be determined according to actual requirements.

Based on the above-mentioned embodiments, in one embodiment of the present disclosure, the metal light-shielding layer 80, as shown in FIG. 18, may include a plurality of first anode power supply lines 82, and the display panel may further include second anode power supply lines 91 disposed at a different layer of the first anode power supply lines 82. The first anode power supply lines 82 may have a one-to-one correspondence with the second anode power supply lines 91 and may be connected in parallel with the corresponding second anode power supply lines 91, thereby reducing the signal attenuation when the signals inputted from input terminals of the second anode power supply lines 91 are transmitted to output terminals of the second anode power supply lines 91.

Based on the above-mentioned embodiments, in one embodiment of the present disclosure, the display panel may be an organic light-emitting diode (OLED) display panel. The multi-layer insulating layer may include a first insulating layer 71 on the first side surface of the support element 60, a second insulating layer 72 on a side of the first insulating layer 71 away from the support element 60, a third insulating layer 73 on a side of the second insulating layer 72 away from the first insulating layer 71, and a fourth insulating layer 74 on a side of the third insulating layer 73 away from the second insulating layer 72. The display panel may further include a channel layer 93 between the support element 60 and the first insulating layer 71, a gate electrode 96 between the first insulating layer 71 and the second insulating layer 72, a source electrode 94 and a drain electrode 95 between the third insulating layer 73 and the fourth insulating layer 74 where the source electrode 94 and the drain electrode 95 may pass through the third insulating layer 73 and the second insulating layer 72 to be electrically connected to the channel layer 93, an anode 97 electrically connected to the drain electrode 95 through the metal light-shielding layer, and a planarization layer covering the anode where the planarization layer may have an opening for forming a light-emitting layer. The channel layer, the source electrode and the drain electrode may form a thin-film transistor structure which may control the pixel operation by controlling a drive signal applied to the anode.

It should be noted that, based on the above-mentioned embodiments, in one embodiment of the present disclosure, the display panel may reduce the quantity of the light-transmitting hole groups in the light-transmitting hole combination region under the premise of ensuring that the sizes of the light-transmitting holes and the distances between adjacent light-transmitting holes are constant, thereby improving the diffraction phenomenon of the light-transmitting hole combination region and increasing the light transmittance of the light-transmitting hole combination region. In another embodiment of the present disclosure, the display panel may also reduce the diameters of the light-transmitting holes under the premise of ensuring that the distances between adjacent light-transmitting holes are constant, such that based on improving the diffraction phenomenon of the light-transmitting hole combination region and increasing the light transmittance of the light-transmitting hole combination region, the pixels may be disposed at more regions to improve the resolution of the display panel, which may depend on actual requirements and not be limited according to the embodiments of the present disclosure.

Correspondingly, the embodiments of the present disclosure also provide a display device, which may be applied to any products or components having a display function, such as mobile phones, tablets, televisions, monitors, laptops, digital photo frames, navigators, and other products or devices.

Figure 19:
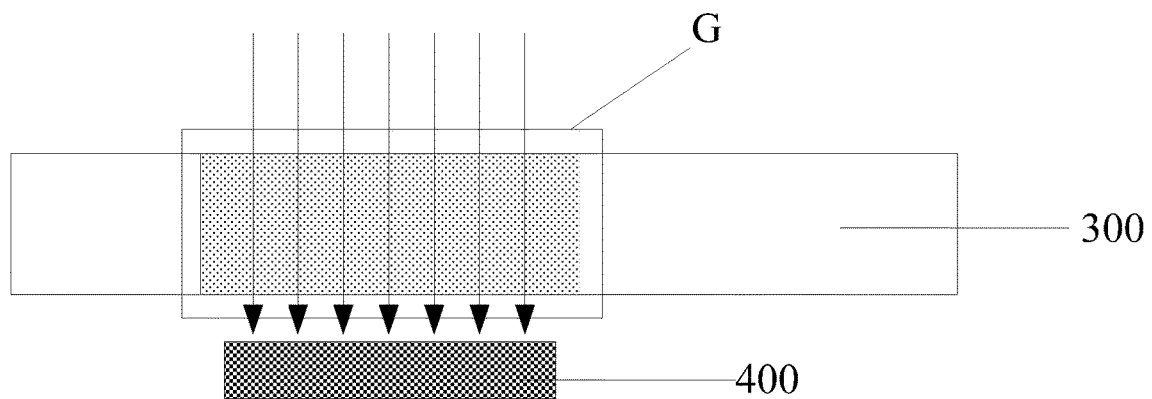
FIG. 19 illustrates a local structural schematic of a display device according to embodiments of the present disclosure.

As shown in FIG. 19, the display device provided in the embodiments of the present disclosure may include the display panel 300 provided in any one of the above-mentioned embodiments, and a light collecting element 400 located at the back side of the display panel 300, where the back side of the display panel may be opposite to the display surface of the display panel. Optionally, the light collecting element 400 may be located at a second display region G, which may facilitate the image collection through light transmitted through the second display region G.

It should be noted that, since the problem solving principle of the display device is similar to that of the display panel described above, the implementation of the display device may refer to the implementation of the display panel described above, and duplicated details may not be described herein according to the embodiments of the present disclosure.

Optionally, based on the above-mentioned embodiments, in one embodiment of the present disclosure, the light collecting element may be a camera, which may facilitate the image collection through light transmitted through the second display region G. In another embodiment of the present disclosure, the light collecting element may also be a fingerprint recognition sensor to implement under-screen fingerprint recognition. In other embodiments, the display panel may also have two second display regions, a camera may be disposed in one second display region and a fingerprint recognition sensor may be disposed in another second display region, which may depend on actual requirements and not be limited according to the embodiments of the present disclosure.

Figure 20:
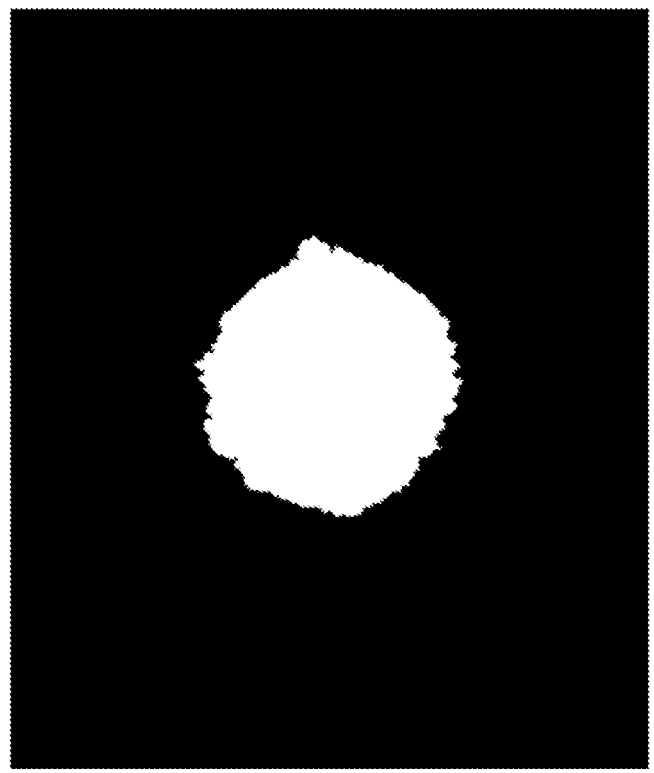
FIG. 20 illustrates a schematic of an acquired spot in a display device when a camera, a light collecting element, collects images of a light source using a light-transmitting hole combination region in a provided display panel according to embodiments of the present disclosure.
Figure 21:
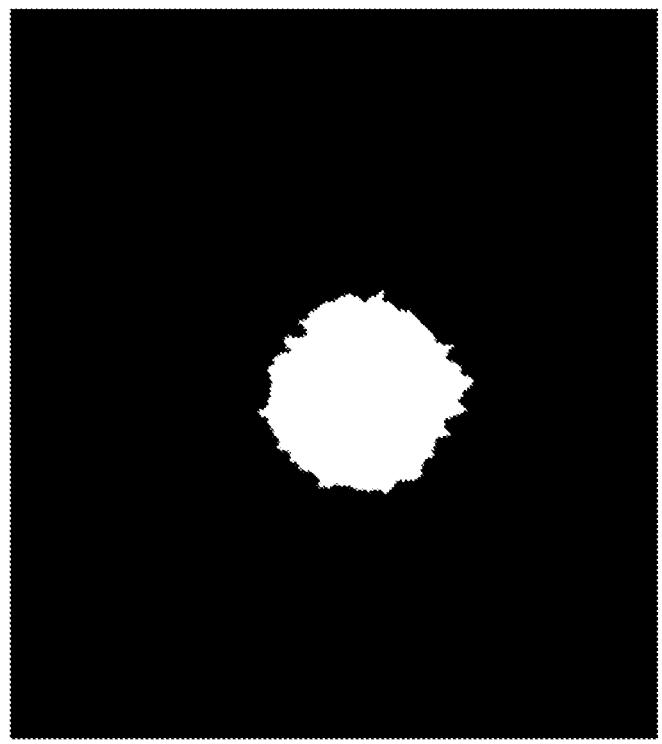
FIG. 21 illustrates a schematic of an acquired spot when a camera is directly used to collect images of a light source according to embodiments of the present disclosure.

As shown in FIGS. 20-21, FIG. 20 illustrates a schematic of an acquired spot in a display device when a camera, a light collecting element, collects images of a light source using a light-transmitting hole combination region in a provided display panel according to embodiments of the present disclosure; and FIG. 21 illustrates a schematic of an acquired spot when a camera is directly used to collect images of the light source according to embodiments of the present disclosure. It may be seen from FIGS. 20-21, the spot obtained when the camera collects images of the light source using the light-transmitting hole combination region in the display panel provided in the embodiments of the present disclosure may be substantially same as the spot obtained when the camera directly collects images of the light source. That is, the display device provided in the embodiment of the present disclosure may significantly reduce the light diffraction phenomenon and improve the image forming quality when the light is used for capturing.

From the above-mentioned embodiments, it can be seen that the display module and the method for monitoring backlight brightness provided by the present disclosure may achieve at least the following beneficial effects.

In the display panel and the display device provided in the embodiments of the present disclosure, the second display region may include the plurality of light-transmitting hole combination regions; at least one light-transmitting hole group may be disposed at each light-transmitting hole combination region; each light-transmitting hole group may include the plurality of light-transmitting holes; the boundary of each light-transmitting hole may be a closed arc and the centers of all light-transmitting holes in each light-transmitting hole group may be distributed along a ring shape. In such way, the diffraction light corresponding to different regions on the boundary line of the light-transmitting hole may overlap and interfere with each other along different directions, and the diffraction spots formed by adjacent light-transmitting holes may overlap and interfere with each other along different directions, thereby reducing the diffraction phenomenon of the spot formed after the light passes through the light-transmitting hole combination region and improving the image forming quality when the light is used for capturing images.

In the display panel provided in the embodiments of the present disclosure, the second display region may further include the plurality of pixels and the plurality of pixel drive circuits. Pixel drive circuits for driving the pixels in the light-transmitting hole combination region may be the first pixel drive circuits. At least the portion of the first pixel drive circuits may be located at the region outside the light-transmitting hole combination region. At least the portion of the pixel drive circuits in the pixel drive circuits for driving the pixels in the light-transmitting hole combination region may be disposed at the region outside the light-transmitting hole combination region, thereby increasing the area used for transmitting light at the light-transmitting hole combination region, improving the light transmittance of the light-transmitting hole combination region, and improving the light intensity when the light is used for capturing images.

Each part in the present disclosure is described in a progressive manner. Each part may focus on the differences from other parts, and the same or similar parts between the parts may refer to each other.

The above-mentioned description of the disclosed embodiments enables those skilled in the art to implement or use the present disclosure. Various modifications to the above-mentioned embodiments may be apparent to those skilled in the art, and the principles defined herein may be implemented in other embodiments without departing from the spirit or scope of the application. Therefore, the present disclosure may not be limited to the embodiments described in the present disclosure but should conform to the widest scope consistent with the principles and novel features disclosed in the present disclosure.

What is claimed is:

1. A display panel, comprising:
a first display region and a second display region, wherein:
the second display region includes a plurality of light-transmitting hole combination regions, wherein:
at each light-transmitting hole combination region, at least two light-transmitting hole groups surround a central light-transmitting hole;
each light-transmitting hole group includes a plurality of light-transmitting holes;
a boundary line of each light-transmitting hole is a closed arc; and
centers of all light-transmitting holes in each light-transmitting hole group are distributed along a ring shape, wherein different light-transmitting hole groups have different ring sizes, different ring shapes corresponding to the at least two light-transmitting hole groups share a common center with a center of the central light-transmitting hole, and each of at least two ring shapes, corresponding to the at least two light-transmitting hole groups, is a circle or an ellipse;
all light-transmitting holes, except the central light-transmitting hole, in the second display region are distributed along a ring shape, and there is no light-transmitting hole between two adjacent light-transmitting hole combination regions; and
the second display region further includes a plurality of pixels and a plurality of pixel drive circuits, wherein:
pixel drive circuits in the plurality of pixel drive circuits used for driving pixels in the light-transmitting hole combination regions are first pixel drive circuits;
at least a portion of the first pixel drive circuits is at a region outside the light-transmitting hole combination regions; and
the pixels in the light-transmitting hole combination regions are exclusively disposed between the at least two light-transmitting hole groups and between the central light-transmitting hole and one of the at least two light-transmitting hole groups directly adjacent to the central light-transmitting hole in the second display region.

2. The display panel according to claim 1, wherein:
centers of all light-transmitting hole groups in each light-transmitting hole combination region coincide with each other.

3. The display panel according to claim 2, wherein:
the at least two light-transmitting hole groups disposed at each light-transmitting hole combination region include a first light-transmitting hole group and a second light-transmitting hole group, wherein:
a distance between each light-transmitting hole in the first light-transmitting hole group and the central light-transmitting hole is greater than a distance between each light-transmitting hole in the second light-transmitting hole group and the central light-transmitting hole; and
a quantity of the light-transmitting holes included in the first light-transmitting hole group is greater than a quantity of the light-transmitting holes included in the second light-transmitting hole group.

4. The display panel according to claim 1, wherein:
the first pixel drive circuits include a plurality of first sub-pixel drive circuit groups, and a first sub-pixel drive circuit group includes at least two pixel drive circuits; and
the plurality of first sub-pixel drive circuit groups is evenly disposed around the light-transmitting hole combination regions.

5. The display panel according to claim 4, wherein:
the second display region includes the plurality of light-transmitting hole combination regions arranged in a matrix; and
the plurality of the first sub-pixel drive circuit groups is evenly disposed at a gap between two light-transmitting hole combination regions which are adjacent to the plurality of the first sub-pixel drive circuit groups.

6. The display panel according to claim 1, wherein:
the first pixel drive circuits further include a plurality of second sub-pixel drive circuit groups; and
the plurality of second sub-pixel drive circuit groups is disposed within the light-transmitting hole combination regions.

7. The display panel according to claim 1, wherein:
the second display region further includes an electrical connection line electrically connecting a pixel with a pixel drive circuit.

8. The display panel according to claim 7, wherein:
the electrical connection line includes a metal wiring which is at a region in the light-transmitting hole combination regions and outside the light-transmitting holes.

9. The display panel according to claim 7, wherein:
the electrical connection line includes a transparent conductive wiring, wherein at least a portion of the transparent conductive wiring is at a region of the light-transmitting holes in the light-transmitting hole combination regions.

10. The display panel according to claim 7, wherein:
the electrical connection line includes a metal wiring and a transparent conductive wiring electrically connected to the metal wiring, wherein the metal wiring is at a region in the light-transmitting combination regions and outside the light-transmitting holes, and at least a portion of the transparent conductive wiring is at a region of the light-transmitting holes in the light-transmitting hole combination regions.

11. The display panel according to claim 7, further including:
a plurality of scan lines arranged along a first direction; and
the plurality of scan lines is at a region outside the light-transmitting hole combination regions in the second display region and passes through gaps between adjacent light-transmitting hole combination regions arranged along a second direction.

12. The display panel according to claim 7, further including:
a plurality of data lines arranged along a second direction; and
the plurality of data lines is at a region outside the light-transmitting hole combination regions in the second display region and passes through gaps between adjacent light-transmitting hole combination regions arranged along a first direction.

13. The display panel according to claim 1, further including:
a support element;
a multi-layer insulating layer on a first side surface of the support element, wherein the multi-layer insulating layer includes at least one organic insulating layer and at least one inorganic insulating layer, and a portion of the multi-layer insulating layer, corresponding to the light-transmitting hole combination regions, includes a plurality of first through holes passing through the at least one organic insulating layer; and
a metal light-shielding layer on a side of the multi-layer insulating layer away from the support element, wherein a portion of the metal light-shielding layer, corresponding to the light-transmitting hole combination regions, includes a plurality of second through holes passing through the metal light-shielding layer; and the plurality of first through holes and the plurality of second through holes have a one-to-one correspondence passing through each other to form the light-transmitting holes of the second display region.

14. The display panel according to claim 13, wherein:
the metal light-shielding layer includes a plurality of first anode power supply lines; and
the display panel further includes second anode power supply lines disposed at a different layer of the first anode power supply lines, wherein the first anode power supply lines have a one-to-one correspondence with the second anode power supply lines and are configured in parallel with the second anode power supply lines corresponding to the first anode power supply lines.

15. A display device, comprising:
a display panel, comprising:
a first display region and a second display region, wherein:
the second display region includes a plurality of light-transmitting hole combination regions, wherein:
at each light-transmitting hole combination region, at least two light-transmitting hole groups surround a central light-transmitting hole;
each light-transmitting hole group includes a plurality of light-transmitting holes;
a boundary line of each light-transmitting hole is a closed arc; and
centers of all light-transmitting holes in each light-transmitting hole group are distributed along a ring shape, wherein different light-transmitting hole groups have different ring sizes, different ring shapes corresponding to the at least two light-transmitting hole groups share a common center with a center of the central light-transmitting hole, and each of at least two ring shapes, corresponding to the at least two light-transmitting hole groups, is a circle or an ellipse;

all light-transmitting holes, except the central light-transmitting hole, in the second display region are distributed along a ring shape, and there is no light-transmitting hole between two adjacent light-transmitting hole combination regions; and the second display region further includes a plurality of pixels and a plurality of pixel drive circuits, wherein:

pixel drive circuits in the plurality of pixel drive circuits used for driving pixels in the light-transmitting hole combination regions are first pixel drive circuits;

at least a portion of the first pixel drive circuits is at a region outside the light-transmitting hole combination regions; and the pixels in the light-transmitting hole combination regions are exclusively disposed between the at least two light-transmitting hole groups and between the central light-transmitting hole and one of the at least two light-transmitting hole groups directly adjacent to the central light-transmitting hole in the second display region.

16. The display device according to claim 15, further including:

a camera, disposed at the second display region.

* * * * *